United States Patent
Fadel et al.

(10) Patent No.: US 10,395,970 B2
(45) Date of Patent: Aug. 27, 2019

(54) DUAL TRENCH STRUCTURE

(71) Applicant: VISHAY-SILICONIX, Santa Clara, CA (US)

(72) Inventors: Maxim Fadel, Hamburg (DE); Gerrit Schoer, Hamburg (DE)

(73) Assignee: VISHAY-SILICONIX, San Jose, CA (US)

( * ) Notice: Subject to any disclaimer, the term of this patent is extended or adjusted under 35 U.S.C. 154(b) by 32 days.

(21) Appl. No.: 14/098,183

(22) Filed: Dec. 5, 2013

(65) Prior Publication Data
US 2015/0162401 A1 Jun. 11, 2015

(51) Int. Cl.
| H01L 21/762 | (2006.01) |
| H01L 29/78 | (2006.01) |
| H01L 29/40 | (2006.01) |
| H01L 29/66 | (2006.01) |
| H01L 21/763 | (2006.01) |
| H01L 29/423 | (2006.01) |

(52) U.S. Cl.
CPC ...... *H01L 21/76224* (2013.01); *H01L 21/763* (2013.01); *H01L 21/76229* (2013.01); *H01L 29/407* (2013.01); *H01L 29/66734* (2013.01); *H01L 29/7811* (2013.01); *H01L 29/4236* (2013.01); *H01L 29/7813* (2013.01)

(58) Field of Classification Search
CPC .............................................. H01L 21/76224
USPC ................................................... 438/430, 435
See application file for complete search history.

(56) References Cited

U.S. PATENT DOCUMENTS

| 5,973,360 A | 10/1999 | Tihanyi |
| 6,191,447 B1 | 2/2001 | Baliga |
| 6,620,691 B2 * | 9/2003 | Hshieh .................. H01L 29/407 257/E29.133 |

(Continued)

FOREIGN PATENT DOCUMENTS

| CN | 102254826 | 11/2011 |
| WO | 2012158977 | 11/2012 |

OTHER PUBLICATIONS

Yang, Xin; et al., Tunable Oxide-Bypassed Trench GAT MOSFET: Breaking the Ideal Superjunction MOSFET Performanceline at Equal Column Width; IEE Electron Device Letters, vol. 24, No. 11, Nov. 2003; pp. 704-706.

(Continued)

*Primary Examiner* — Earl N Taylor

(57) ABSTRACT

A method for fabricating a dual trench structure. The method includes providing a wafer comprising a semiconductor layer including a top surface. The method includes providing charge compensation trenches and termination trenches open to the top surface that are formed in a single etch step but with different final shield oxide thicknesses. A first shield oxide layer of a first thickness is formed on the plurality of charge compensation surfaces and the termination trench surface, wherein the first thickness of the first shield oxide layer is sufficient to allow formation of voids through the charge compensation trenches. Poly-silicon is deposited to form the electrodes in the charge compensation trenches. An isolated poly-silicon etch and clean etch is performed in the termination trenches to expose the first shield oxide layer. A second shield oxide layer is deposited on the first shield oxide layer in the termination trenches.

17 Claims, 10 Drawing Sheets

(56) References Cited

U.S. PATENT DOCUMENTS

| | | | |
|---|---|---|---|
| 7,078,780 B2* | 7/2006 | Wu | H01L 29/0623 257/155 |
| 7,319,256 B1* | 1/2008 | Kraft | H01L 21/823437 257/330 |
| 7,524,726 B2 | 4/2009 | Ma | |
| 8,247,296 B2* | 8/2012 | Grivna | H01L 29/407 257/E21.41 |
| 8,334,566 B2* | 12/2012 | Tai | H01L 29/407 257/330 |
| 8,803,207 B2* | 8/2014 | Grebs | H01L 29/407 257/288 |
| 2003/0001203 A1 | 1/2003 | Ono | |
| 2003/0085422 A1* | 5/2003 | Amali | H01L 29/407 257/329 |
| 2004/0195620 A1* | 10/2004 | Chuang | H01L 29/402 257/335 |
| 2004/0222458 A1* | 11/2004 | Hsieh | H01L 29/7813 257/329 |
| 2005/0127465 A1* | 6/2005 | Chiola | H01L 27/0814 257/471 |
| 2005/0133858 A1 | 6/2005 | Banerjee et al. | |
| 2005/0167742 A1* | 8/2005 | Challa | H01L 21/3065 257/328 |
| 2005/0230744 A1* | 10/2005 | Wu | H01L 29/0623 257/330 |
| 2006/0289929 A1* | 12/2006 | Andrews | H01L 29/66734 257/330 |
| 2007/0032020 A1* | 2/2007 | Grebs | H01L 29/407 438/272 |
| 2007/0155104 A1* | 7/2007 | Marchant | H01L 29/407 438/270 |
| 2007/0290234 A1* | 12/2007 | Wu | H01L 29/66143 257/212 |
| 2008/0166845 A1* | 7/2008 | Darwish | H01L 29/66666 438/270 |
| 2009/0140327 A1 | 6/2009 | Hirao et al. | |
| 2010/0264486 A1 | 10/2010 | Denison | |
| 2011/0084332 A1* | 4/2011 | Kao | H01L 29/0661 257/330 |
| 2011/0136310 A1* | 6/2011 | Grivna | H01L 29/407 438/270 |
| 2011/0165757 A1* | 7/2011 | Kim | H01L 21/76229 438/427 |
| 2011/0212586 A1* | 9/2011 | Grebs | H01L 29/407 438/270 |
| 2011/0233659 A1* | 9/2011 | Tai | H01L 29/407 257/330 |
| 2011/0233667 A1 | 9/2011 | Tai et al. | |
| 2011/0254084 A1 | 10/2011 | Terrill et al. | |
| 2012/0168897 A1* | 7/2012 | Ma | H01L 21/76232 257/506 |
| 2013/0020671 A1* | 1/2013 | Lee | H01L 29/407 257/490 |
| 2013/0207227 A1* | 8/2013 | Azam | H01L 29/407 257/508 |
| 2013/0299996 A1* | 11/2013 | Grivna | H01L 29/407 257/774 |
| 2014/0284700 A1 | 9/2014 | Nozu | |
| 2014/0374825 A1 | 12/2014 | Kelkar et al. | |
| 2015/0162401 A1* | 6/2015 | Fadel | H01L 21/76224 257/493 |
| 2017/0012118 A1 | 1/2017 | Park et al. | |

OTHER PUBLICATIONS

Liang, Yung C; "Oxide-Bypassed VDMOS (OBVDMOS): An Alternative to Superjunction High Voltage MOS Power Devices"; IEEE Electron Device Letters, vol. 22, No. 8; Aug. 2001; pp. 407-409.

* cited by examiner

400

---
410
SIMULTANEOUSLY FORMING A PLURALITY OF CHARGE COMPENSATION TRENCHES AND A TERMINATION TRENCH IN A SEMICONDUCTOR LAYER, WHEREIN THE PLURALITY OF CHARGE COMPENSATION TRENCHES IS OPEN TO A TOP SURFACE OF THE SEMICONDUCTOR LAYER, AND WHEREIN THE TERMINATION TRENCH IS OPEN TO THE TOP SURFACE IN THE SEMICONDUCTOR LAYER

---
420
OXIDIZING EXPOSED SURFACES OF THE PLURALITY CHARGE COMPENSATION TRENCHES AND THE TERMINATION TRENCH

---
430
DEPOSITING A FIRST SHIELD OXIDE LAYER OF A FIRST PREDETERMINED THICKNESS ON THE EXPOSED SURFACES OF THE PLURALITY OF CHARGE COMPENSATION AND THE TERMINATION TRENCH, WHEREIN THE FIRST PREDETERMINED THICKNESS OF THE FIRST SHIELD OXIDE LAYER IS CONFIGURED FOR FORMATION OF ELECTRODES IN THE CHARGE COMPENSATION TRENCHES, WHEREIN THE FIRST PREDETERMINED THICKNESS IS CONFIGURED TO ALLOW FORMATION OF VOIDS THROUGH CENTERS OF THE PLURALITY OF COMPENSATION TRENCHES

FIG. 4

DUAL TRENCH STRUCTURE

BACKGROUND

Traditional power/control MOSFETs (metal oxide semiconductor field effect transistors) are based on a dual trench technology including charge compensation trenches and a termination trench. The charge compensation trenches provide for proper operation of power MOSFETs located near trenches in both on and off states.

Heretofore, fabrication approaches of power MOSFETs based on the dual trench technology includes an increased shield oxide thickness in the termination trench over the oxide thickness in the charge compensation trenches. That is, separate operations are performed to obtain the proper thickness of the oxide layers in the termination trench and the charge compensation trenches. The fabrication approach is described generally, as follows. First, a deposition of the desired shield oxide for the termination trench is performed. This is followed by the deposition of doped poly-silicon to form the electrode in the termination trench. Second, the oxide is removed from the charge compensation trenches. Third, deposition of the desired shield oxide for the charge compensation trenches is performed. This is followed by the deposition of doped poly-silicon to form the electrodes of the charge compensation trenches.

A particular problem with traditional fabrication techniques for dual trench technology is the susceptibility of cracks in one or more of the charge compensation trenches. In particular, during the deposition of the first shield oxide to the required thickness for the termination trench, the charge compensation trenches are completely filled with oxide. This is due to their smaller dimensions. For illustration, PRIOR ART FIG. 1 shows a device 100 having a dual trench technology, including charge compensation trenches 110A and 110B, and a termination trench 120. A crack 130 is shown formed within charge compensation trench 110A.

Crack 130 is formed from further processing at elevated temperature while the charge compensation trenches are still filled with oxide. In particular, after poly-silicon is deposited into the termination trench and etched back below the semiconductor mesa, an oxide trench refill is performed to protect the poly-silicon in the termination trench. This oxide refill is performed at high temperature. Due to the mismatch in thermal expansion coefficient between silicon and oxide, the oxide filled charge compensation trenches are susceptible to cracking at the higher temperature during the oxide refill due to mechanical stresses. On the other hand, the poly-silicon filled termination trench is less susceptible to cracking. This is more pronounced for devices having deeper trenches.

Additionally, a further processing risk involves a nitride hard mask used to shield the termination trench during the removal of the oxide from the charge compensation trenches. The shielding ability of the nitride hard mask is negatively impacted due to any variation from design in prior process operations. For instance, the oxide within the trench may be etched away due to insufficient protection by the nitride hard mask.

SUMMARY

In embodiments of the present invention, a method for fabricating a dual trench structure is described. The method includes providing a wafer comprising a semiconductor layer including a top surface. The method further includes providing a plurality of charge compensation trenches open to the top surface and formed within the semiconductor layer. The plurality of charge compensation trenches comprises a plurality of charge compensation trench surfaces. The method also includes providing a termination trench open to the top surface and formed within the semiconductor layer. The termination trench comprises a termination trench surface. The method includes forming a first shield oxide layer of a first predetermined thickness on the plurality of charge compensation surfaces and the termination trench surface. The first predetermined thickness of the first shield oxide layer is sufficient to allow formation of voids through centers of the plurality of charge compensation trenches.

In other embodiments of the present invention, a semiconductor device is disclosed. The device includes a semiconductor layer including a top surface. The device also includes a plurality of charge compensation trenches open to the top surface. The charge compensation trenches are formed within the semiconductor layer, wherein the trenches comprise a plurality of charge compensation trench surfaces. A termination trench open to the top surface is formed within the semiconductor layer. The termination trench comprises a termination trench surface. The device also includes a first shield oxide layer of a first predetermined thickness formed on the charge compensation surfaces and the termination trench surface. The predetermined thickness of the oxide layer is sufficient to allow formation of a plurality of voids through centers of the plurality of charge compensation trenches and the termination trench.

In still other embodiments of the present invention, another method for fabricating a dual trench structure is described. The method includes simultaneously forming a plurality of charge compensation trenches and a termination trench in a semiconductor layer. The plurality of charge compensation trenches is open to a top surface of the semiconductor layer, and wherein the termination trench is open to the top surface in the semiconductor layer. The method includes oxidizing exposed surfaces of the plurality charge compensation trenches and the termination trench. The method further includes depositing a first shield oxide layer of a first predetermined thickness on the exposed surfaces of the plurality of charge compensation and the termination trench. The first predetermined thickness of the first shield oxide layer is configured for formation of electrodes in the charge compensation trenches, wherein the first predetermined thickness is configured to allow formation of voids through centers of the plurality of charge compensation trenches.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

PRIOR ART

FIG. 4 is a flow diagram illustrating a method for fabricating a dual trench structure configured for use in fabricating power MOSFETs that is not susceptible to cracking within the charge compensation trenches during fabrication, in accordance with one embodiment of the present disclosure.

Figure 1:
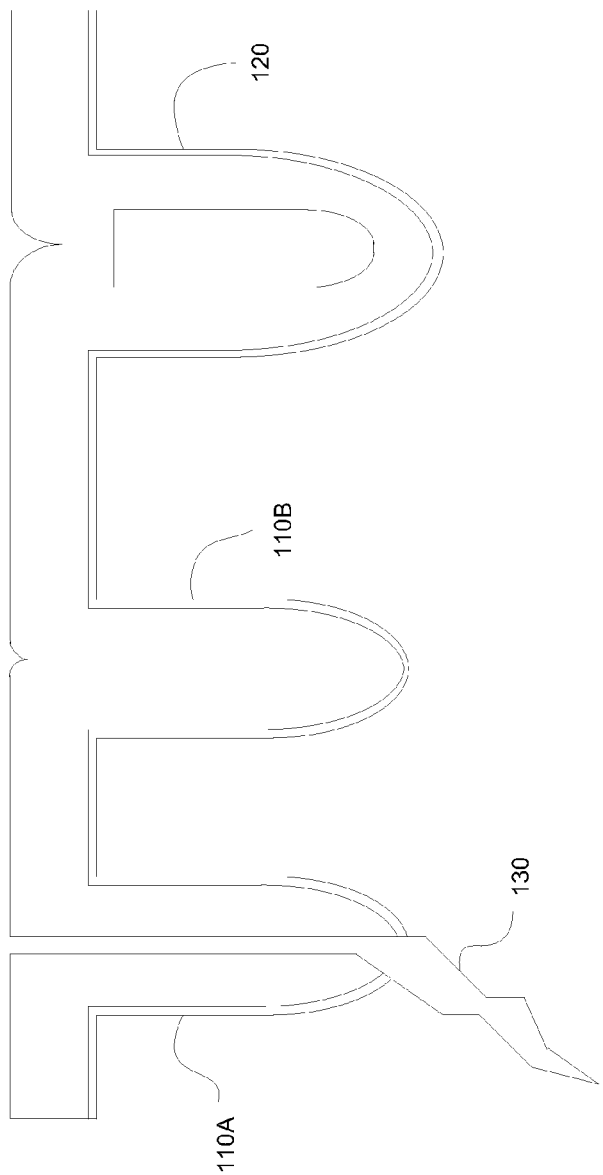
FIG. 1 is a cross-sectional view of a dual trench structure susceptible to cracking in the charge compensation trenches during fabrication because of a complete oxide fill of the charge compensation trenches.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "providing," "extending," "depositing," "etching" or the like, refer to actions and processes of semiconductor device fabrication.

As used herein, the letter "n" refers to an n-type dopant and the letter "p" refers to a p-type dopant. A plus sign "+" or a minus sign "−" is used to represent, respectively, a relatively high or relatively low concentration of the dopant.

Also, the term "channel" is used herein in the accepted manner. That is, current moves within a MOSFET in a channel, from a source connection to the drain connection. Embodiments of the present invention provide for a dual trench structure suitable for use in the fabrication of either n-channel or p-channel devices. As such, features described herein can be utilized in n-channel devices or p-channel devices.

Accordingly, embodiments of the present invention disclose dual trench structures configured for use in fabricating power MOSFETs, wherein the dual trench structure is not susceptible to cracking within charge compensation trenches during fabrication because there is not a complete oxide fill of those trenches. Further, a nitride deposition and patterning can be avoided during fabrication because the etching of oxide in one or more trenches is avoided, and instead replaced with poly-silicon etching in one or more trenches which uses a photo-resist mask and not the use of a hard nitride mask. Further, selectivity of the poly-silicon etching is high since it does not attack the underlying oxide layer. This selectivity improves process stability because the configuration of the oxide lined trench sidewalls and trench bottom remain the same, even after over-etching.

First described is a process for fabricating a device according to embodiments of the invention. Although specific steps are disclosed, such steps are only examples. That is, embodiments according to the present invention are well suited to performing other steps or variations of the recited steps. Only certain portions of the structures are provided in the figures, as well as the various layers that form those structures, may be shown in there figures. Furthermore, for clarity in the drawings, regions and elements of device structures may be represented with boundaries having generally straight line edges, and angular corners. However, it is understood that due to various fabrication techniques (e.g., diffusion and activation of dopants), these edges may not be straight lines or precise angles. Moreover, other fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) structures, processes, and steps without significantly perturbing them. Generally speaking, embodiments in accordance with the present invention can replace portions of a conventional device or process without significantly affecting peripheral structures, processes and steps.

Figure 2:
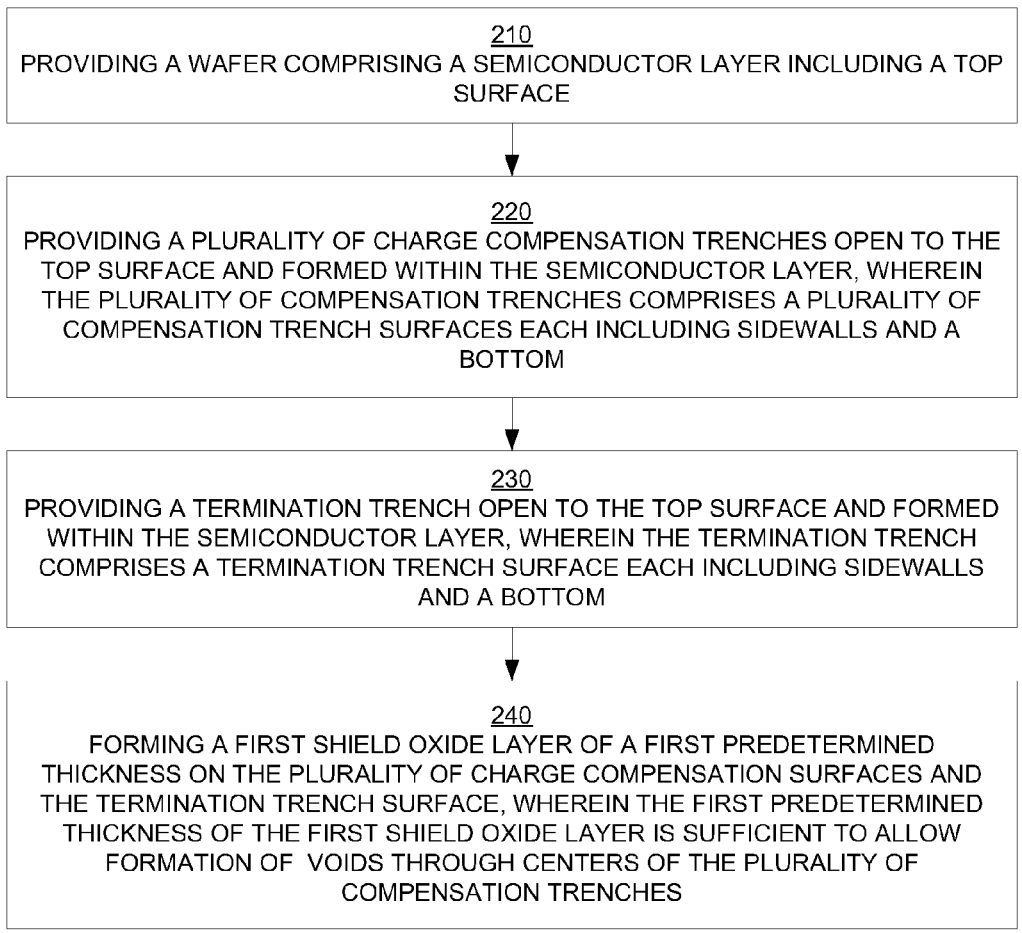
FIG. 2 is a flow diagram illustrating a method for fabricating a dual trench structure configured for use in fabricating power MOSFETs that does not include a complete oxide fill of the charge compensation trenches, in accordance with one embodiment of the present disclosure.

FIG. 2 is a flow diagram 200 illustrating a method for fabricating a dual trench structure configured for use in fabricating power MOSFETs that does not include a complete oxide fill of the charge compensation trenches, in accordance with one embodiment of the present disclosure. Because the process flow for the dual trench structure avoids a complete oxide fill of the charge compensation trenches, these trenches are less or not susceptible to cracking during high temperature process steps. FIGS. 3A-G illustrate various fabricating stages of a dual trench structure, as described in flow diagram 200. Specifically, FIGS. 3A-G are cross-sectional views showing elements of a dual trench structure configured for use in fabricating power MOSFETs, wherein the dual trench structure is not susceptible to cracking within the charge compensation trenches because there is no complete oxide fill of the charge compensation trenches during fabrication, according to embodiments of the present invention.

Figure 3A:
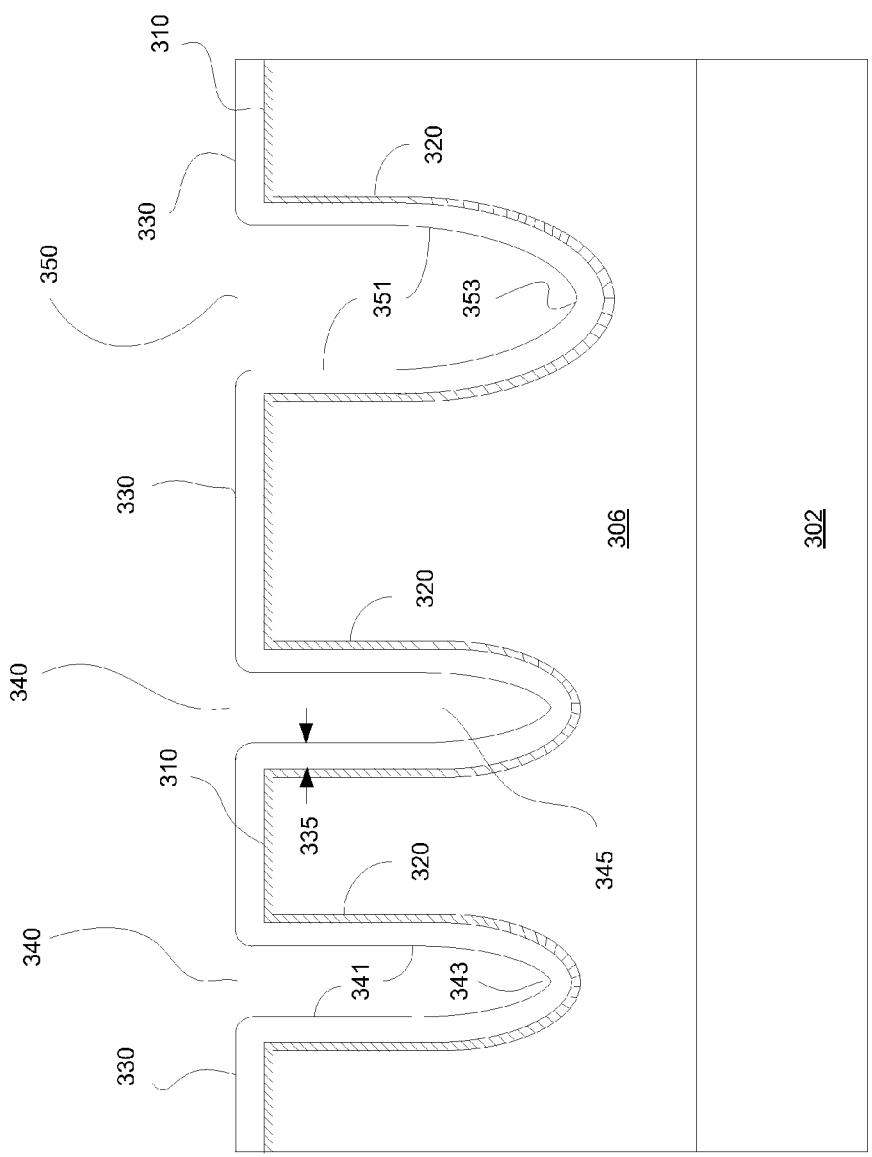
FIGS. 3A-G are cross-sectional views showing elements of a dual trench structure configured for use in fabricating power MOSFETs at various fabricating stages, wherein the dual trench structure is not susceptible to cracking within the charge compensation trenches because there is no complete oxide fill of the charge compensation trenches during fabrication, according to embodiments of the present invention.

Turning now to operation 210 and FIG. 3A, the method includes providing a wafer comprising a semiconductor layer including a top surface 310. Specifically, the semiconductor layer comprises an epitaxial layer 306 that is grown over a substrate 302. The epitaxial layer 306 may comprise a p-type grown over a heavily doped (p++) substrate 302 suitable for fabricating p-channel devices, in one embodiment. In another embodiment, the epitaxial layer 306 may comprise an n-type grown over a heavily doped (n++) substrate 302 suitable for fabricating n-channel devices. Additional p-type or n-type implants (not shown) can then be carried out to selectively enhance or invert the epitaxial doping.

At operation 220, the method includes providing a plurality of charge compensation trenches 340 open to the top surface 310 and formed within the semiconductor layer (e.g., epitaxial layer 306). The plurality of charge compensation trenches 340 comprises a plurality of charge compensation trench surfaces, wherein the surfaces are associated with trench sidewalls 341 and trench bottoms 343. For instance, a surface of a charge compensation trench 340 includes trench sidewalls 341 and a trench bottom 343.

At operation 230, the method includes providing a termination trench 350 open to the top surface 310 and formed within the semiconductor layer (e.g., epitaxial layer 306). The termination trench 350 comprises a termination trench surface, wherein the surface is associated with trench sidewalls 351 and a trench bottom 353.

Formation of the deep trenches may be implemented using various well known techniques to fabricate the two differently shaped trenches described above. In particular, the charge compensation trenches 340 are less deep and less wide than the termination trench 350. In general, trench fabrication includes a photolithographic process to selectively deposit photoresist (not shown) in areas outside a region where trenches are to be formed. Additional hard masking may also be performed to isolate one or more trenches. An etching process is performed to etch away the epitaxial layer 306 where the charge compensation trenches 340 and the termination trench are formed. In one embodiment, the charge compensation trenches 340 and the termination trench 350 are fabricated using a single etching of the epitaxial layer 306. Thereafter, a resist strip and polymer removal may be performed.

Turning now to operation 240 and still with reference to FIG. 3A, the method includes forming a first shield oxide layer 330 of a first predetermined thickness on the plurality of charge compensation surfaces and the termination trench surface. The first shield oxide layer 330 overlays exposed surfaces of the semiconductor wafer. For instance, a plasma or TEOS (tetraethyl orthosilicate) oxide is deposited (e.g., 0.2-0.7 μm at 500° C.-700° C., with or without annealing) to complete the first shield oxide layer 330.

In particular, FIG. 3A shows an enlarged partial cross-sectional view of a dual trench structure 300A at a stage in fabrication that includes the shield oxide layer 330 deposited over an oxidation layer 320, which is a thin layer of oxide (e.g., silicon dioxide). That is, after trench formation, a thermal oxidation process is performed on the wafer. For instance, an oxidizing agent is diffused into exposed surfaces of the wafer at high temperature, and a subsequent oxidation reaction occurs to create oxidation layer 320. For example, oxidation layer 320 may have a thickness of 1000-4000 Angstroms.

The predetermined thickness 335 of the first shield oxide layer 330 is configured to allow formation of voids 345 through the centers of the plurality of compensation trenches 340. In addition, the predetermined thickness 335 of the shield oxide layer 330 is configured to allow for the later formation of electrodes in the voids 345 of the charge compensation trenches 340.

Shield oxide formation in the charge compensation trenches is complete, since the first predetermined thickness 335 is configured for the charge compensation trenches 340. That is, no further deposition or etching of oxide is needed in the formation of the charge compensation trenches 340. Further, as is shown in FIG. 3A, the first shield oxide layer 330 is also deposited within the termination trench 350. Because the shield oxide layer protecting the termination trench 350 is thicker than the first predetermined thickness 335 sufficient for the charge compensation trench 340, additional oxide deposition and/or etching steps are necessary to complete the shield oxide formation in the termination trench 350, as will be described below. Since the oxide formation is complete in the charge compensation trenches 340 and because the oxide does not completely fill the void 345 in the charge compensation trenches 340, subsequent oxide formation in the termination trench 350 will not adversely affect the formation in the charge compensation trenches 340, and as such, embodiments of the present invention are not susceptible to cracking in the charge compensation trenches.

Figure 3B:
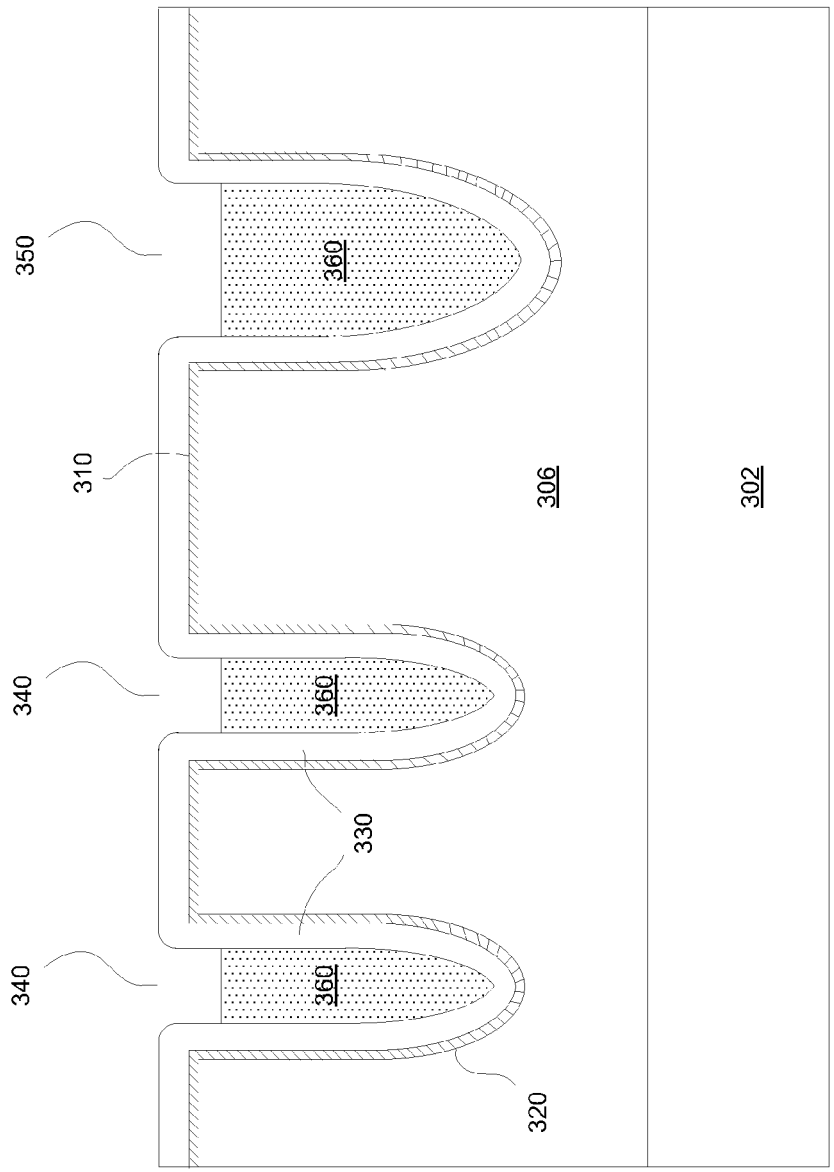

FIG. 3B shows an enlarged partial cross-sectional view of a dual trench structure 300B after further steps in fabrication. In particular, the method for fabricating the dual trench structure outlined in FIG. 2 continues and includes filling the plurality of compensation trenches and the termination trench with doped amorphous or poly-silicon or a combination of both. 360. At this stage, the poly-silicon covers the first shield oxide layer 330, such that the thickness of the poly-silicon overfills the charge compensation trenches 340 and the termination trench 350. The poly-silicon is planarized with selective chemical-mechanical planarization/polishing techniques, etch-back techniques, combinations thereof, or the like. For instance, during the planarization process, the overfilled poly-silicon is selectively planarized down to the first shield oxide layer 330. Subsequently, the poly-silicon is etched back down below the top surface 310 of the semiconductor or epitaxial layer 306. That is, a recess etching is performed of the poly-silicon to below the top surface 310 (e.g., a few nanometers below the top surface 310). As a result, the remaining poly-silicon 360 is located in the charge compensation trenches 340 and the termination trench, and is etched back from the top surface 310.

The poly-silicon 360 in the charge compensation trenches 340 form the electrodes. Also, the first shield oxide layer 330 is of sufficient thickness to insulate the charge compensation trenches 340 for the voltage applied to the electrode in the trench 340. However, the thickness of the oxide layer 330 in the termination trench 350 is insufficient for the voltage applied in trench 350. Subsequent steps include the additional deposition of shield oxide in the termination trench 350 and poly-silicon fill in isolation, as is further described below.

Figure 3C:
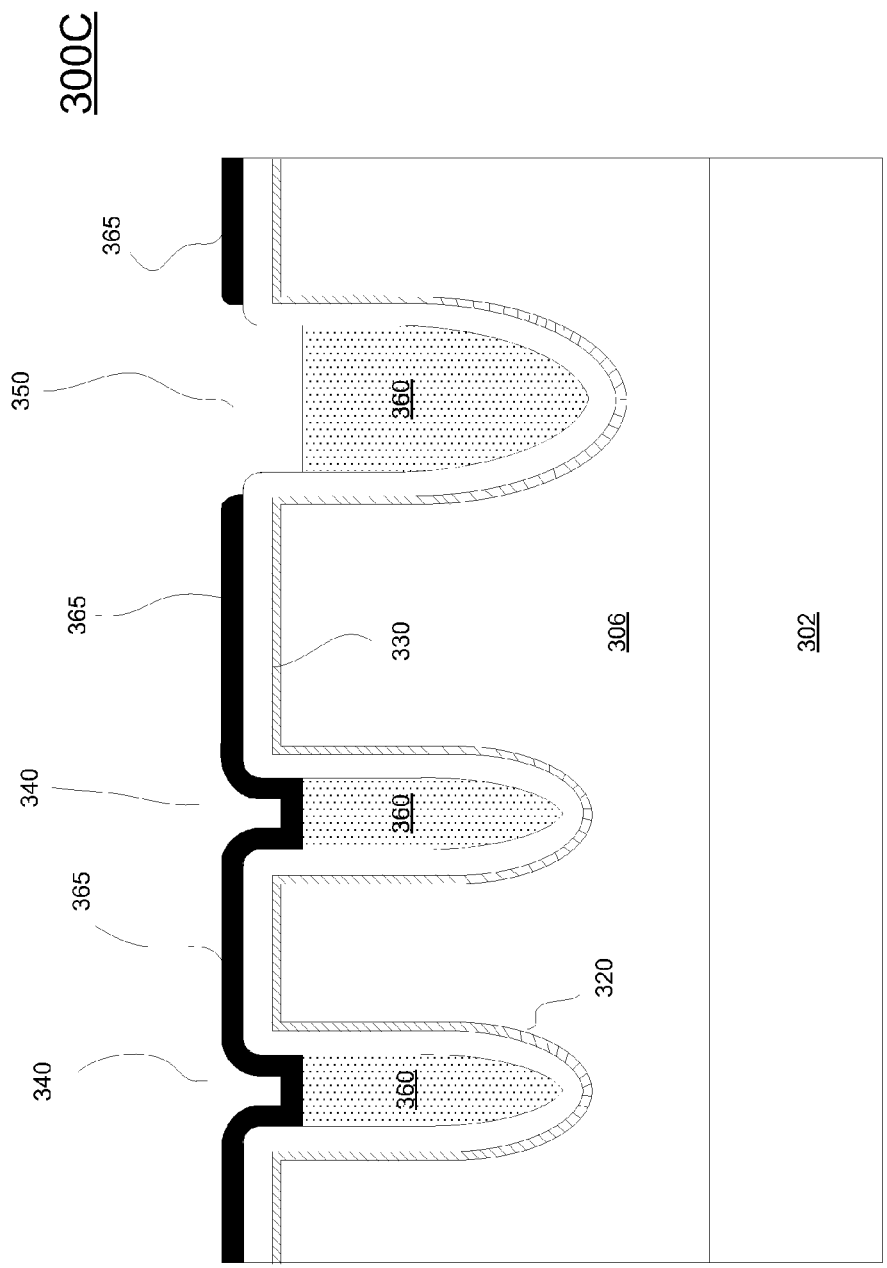

FIG. 3C shows an enlarged partial cross-sectional view of a dual trench structure 300C after further steps in fabrication. In particular, the method for fabricating the dual trench structure outlined in FIG. 2 continues and includes performing a photolithographic process to selectively deposit photoresist in all areas outside of the termination trench 350. In this manner, the photoresist 365 isolates, in part, the plurality of charge compensation trenches 340. Put another way, the photoresist 365 exposes the termination trench 350 to further etching and deposition processes, but shields the plurality of charge compensation trenches 340 from the same etching and deposition processes.

Figure 3D:
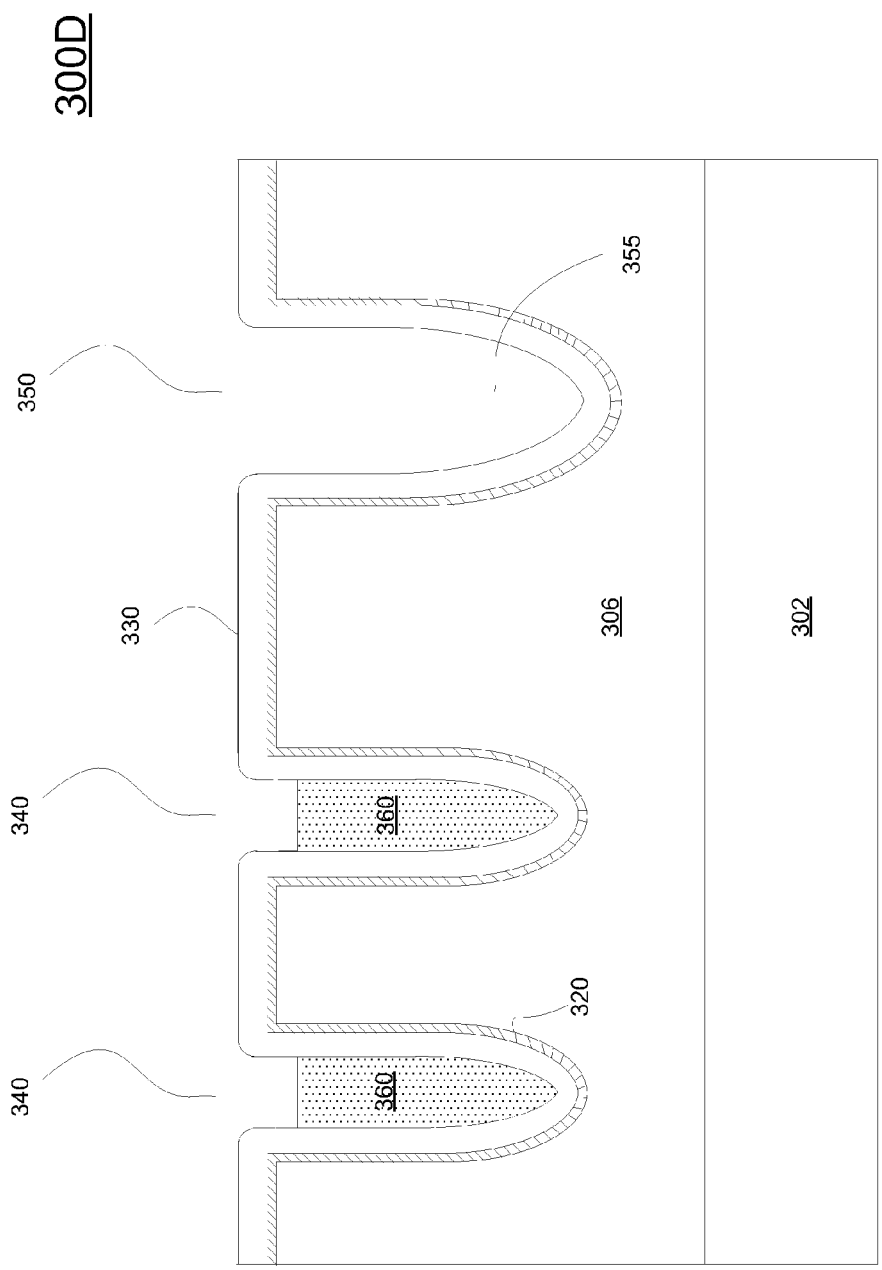

FIG. 3D shows an enlarged partial cross-sectional view of a dual trench structure 300D after further steps in fabrication. In particular, the method for fabricating the dual trench structure outlined in FIG. 2 continues and includes etching poly-silicon from the termination trench 350 to expose the first shield oxide layer 330. For example, a dry chemical etch is performed to remove the poly-silicon 360, which leaves a void 355.

Figure 3E:
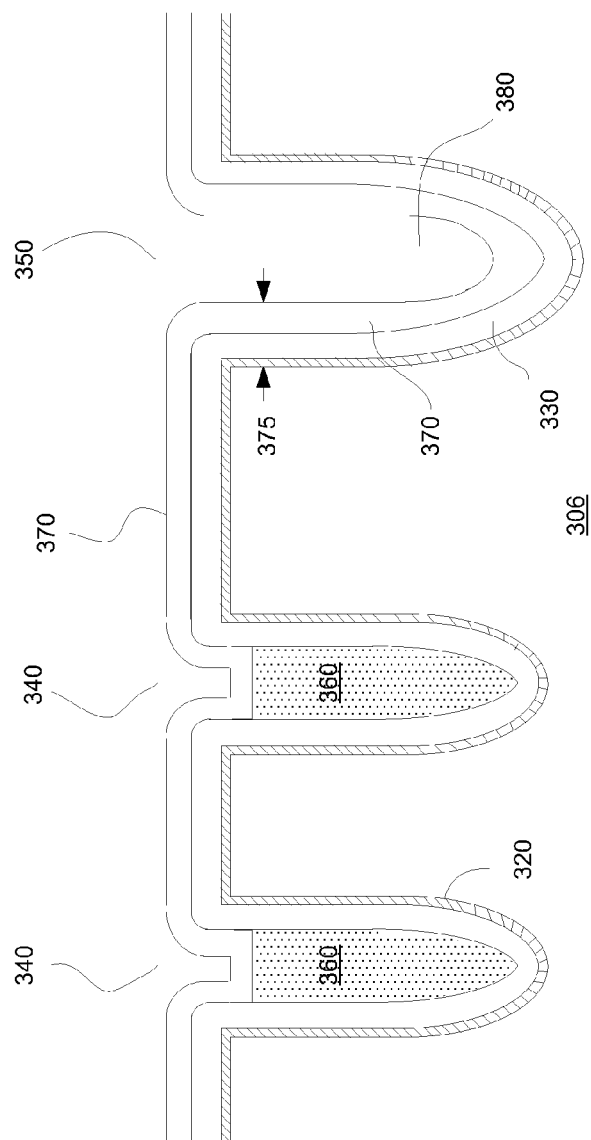

FIG. 3E shows an enlarged partial cross-sectional view of the dual trench structure 300E after further steps in fabrication. In particular, the method for fabricating the dual trench structure outlined in FIG. 2 continues and includes stripping the photoresist layer 365. In addition, the method includes performing a wet-chemical (e.g., diluted hydrofluoric acid, buffered oxide etch [BOE], etc.) clean treatment in a sink or spin rinse tool. That is, the oxide surface in the termination trench is cleaned to prepare for additional oxide formation. As a result, a well-controlled conditioning of the first shield oxide layer 350 is performed.

After cleaning the wafer, the method includes depositing an additional shield oxide layer over the cleaned first shield oxide 330 in the termination trench 350. That is, the method includes forming a second shield oxide layer 370 over the first shield oxide layer 330 that is exposed in the termination trench 350. For example, a TEOS oxide is deposited at high temperature to a certain thickness, with or without annealing. The first and second shield oxide layers combined (330 and 370) formed in the termination trench 350 comprise a second predetermined thickness 375—that is sufficient to allow formation of a void 380 in the termination trench 350. As a result, as is shown in FIG. 3E, the shield oxide of the first predetermined thickness 335 in the plurality of charge compensation trenches is less thick than the shield oxide of the second predetermined thickness 375 in the termination trench. In this manner, the thicker shield oxide (330 and 370) can handle the higher voltage applied to the later formed electrode associated with the termination trench 350, when compared to voltages applied to the charge compensation trenches 340.

As is shown in FIG. 3E, the second shield oxide layer 370 is also deposited over the polysilicon 360 in the charge compensation trenches 340.

Figure 3F:
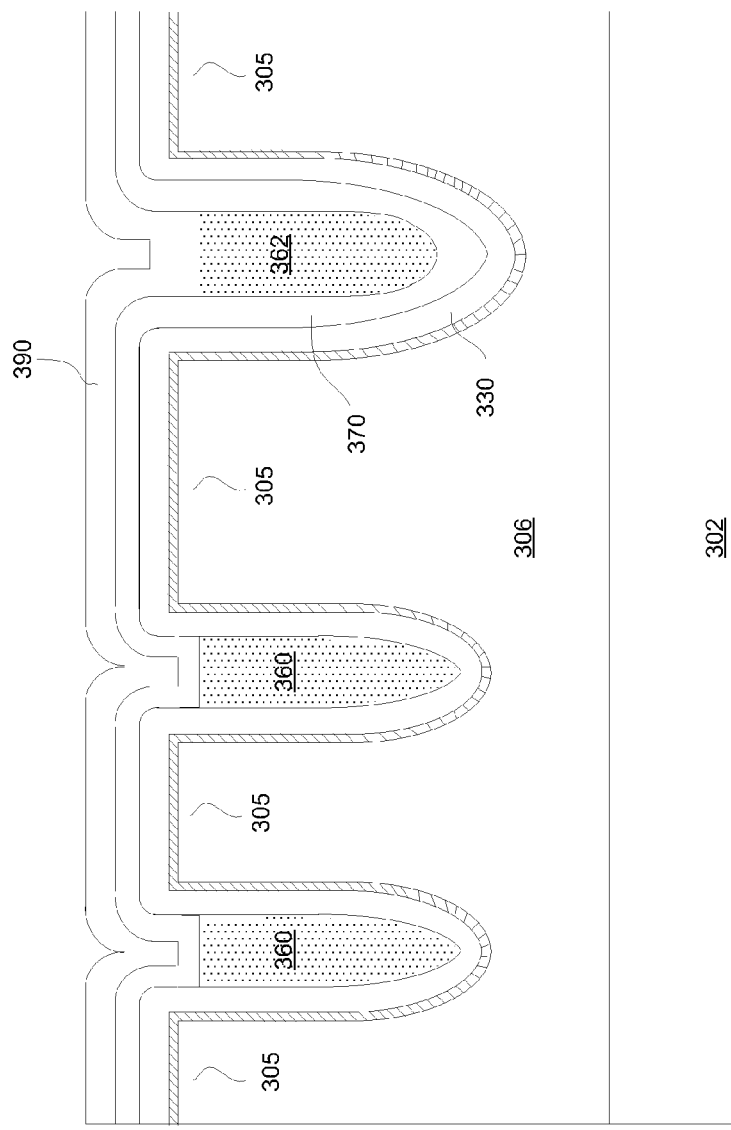

FIG. 3F shows an enlarged partial cross-sectional view of the dual trench structure 300F after further steps in fabrication. In particular, the method for fabricating the dual trench structure outlined in FIG. 2 continues and includes filling the termination trench 350 with doped amorphous or poly-silicon or a combination of both 362. At this point, the poly-silicon covers (not shown) the second shield oxide layer 370 located in the termination trench 350, mesa regions 305, the plurality of charge compensation trenches 340. That is, the poly-silicon 362 overfills the termination trench 350. As such, the poly-silicon is planarized with selective chemical-mechanical planarization/polishing techniques, etch-back techniques, combinations thereof, or the like. For instance, during the planarization process, the poly-silicon is planarized down (not shown) to the surface of the second shield oxide layer 370. Subsequently, the poly-silicon is etched back down below (e.g., a few nanometers below) the top surface 310 of the semiconductor or epitaxial layer 306. As a result, the remaining poly-silicon 362 is located in the termination trench 350, etched back from the top surface 310, and configured for electrode formation.

As shown in FIG. 3F, the method outlined in FIG. 2 continues to include performing a shield oxide layer refill of the termination trench 350. That is, a trench fill is performed to deposit shield oxide 390 over the poly-silicon 362 exposed in the termination trench 350. The shield oxide 390 also is deposited over the second shield oxide layer 370 located over the mesas 305 separating the trenches 330 and 350, and the charge compensation trenches 330 and termination trench 350. For example, a TEOS oxide is deposited at high temperature to a certain thickness, with or without annealing.

Figure 3G:
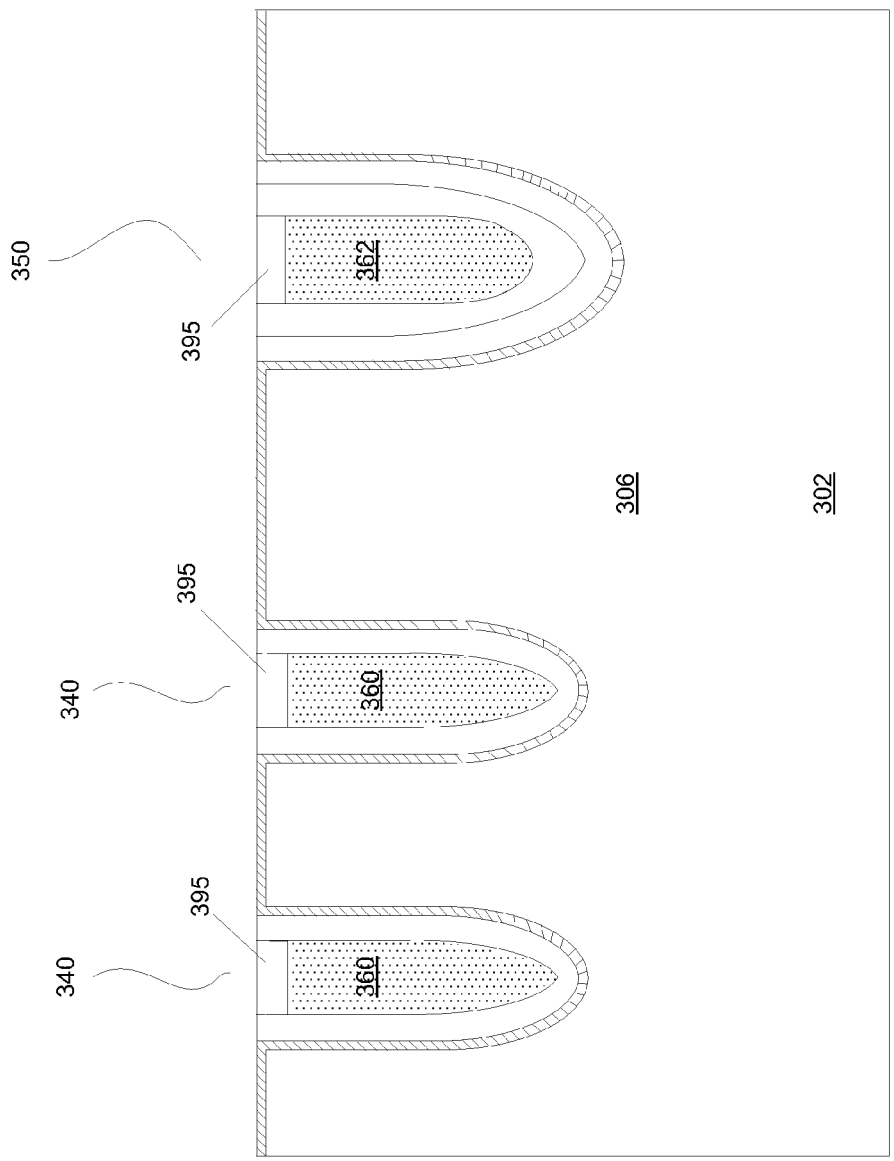

FIG. 3G shows an enlarged partial cross-sectional view of the dual trench structure 300G after further steps in fabrication. In particular, the method for fabricating the dual trench structure outlined in FIG. 2 continues and includes performing planarization with selective chemical-mechanical planarization/polishing techniques, etch-back techniques, combinations thereof, or the like to remove shield oxide down to approximately the top surface 310 of the semiconductor/epitaxial layer 306. In this manner, shield oxide 395 remains over the poly-silicon 360 in the charge compensation trenches 340, as well as over the poly-silicon 362 in the termination trench 350.

FIG. 4 is a flow diagram 400 illustrating a method for fabricating a dual trench structure configured for use in fabricating power MOSFETs that is not susceptible to cracking within the charge compensation trenches during fabrication, in accordance with one embodiment of the present disclosure. Flow diagram 400 illustrates a process flow for manufacturing a dual trench structure without a complete oxide filling of the charge compensation trenches, and without needing a nitride hard-mask. As such, the dual trench structure fabricated using the fabrication process outlined in flow diagram 400 is not susceptible to cracking in the charge compensation trenches, especially during higher temperature process steps.

At 410, the method includes simultaneously forming a plurality of charge compensation trenches and a termination trench in a semiconductor layer. The plurality of charge compensation trenches is open to a top surface of the semiconductor layer (e.g., epitaxial layer), and wherein the termination trench is open to the top surface.

At 420, the method optionally includes oxidizing exposed surfaces of the plurality charge compensation trenches and the termination trench. That is, after trench formation, a thermal oxidation process is performed on the wafer.

At 430, the method includes depositing a first shield oxide layer of a first predetermined thickness on the exposed surfaces of the plurality of charge compensation and the termination trench. If oxidization was performed, the first shield oxide layer is deposited on exposed surfaces of the oxidized layer. The first predetermined thickness of the first shield oxide layer is configured for formation of electrodes in the charge compensation trenches, and to provide insulation to the wafer from the voltages applied to those electrodes. That is, the first predetermined thickness is configured to allow formation of voids through centers of the plurality of compensation trenches, wherein electrodes are formed in those voids.

The first shield oxide layer also covers the surface of the termination trench. However, the thickness of the shield oxide is insufficient to insulate the termination trench because of higher voltages applied to that trench.

At this point, the method includes depositing doped poly-silicon over the first shield oxide layer in the plurality of compensation trenches and the termination trench. The poly-silicon in the charge compensation trenches is used to form the electrodes. As such, the method further includes a planarization step (e.g., CMP) to remove poly-silicon until reaching the first shield oxide layer covering the top surface of the semiconductor layer, and a recess step to etch back the polysilicon below a top surface.

To remove the poly-silicon from the termination trench, a photoresist mask is structured to isolate the plurality of charge compensation trenches. By forming the oxide layering the charge compensation trenches first, this avoids the use of a nitride hard mask for protecting the termination trench when preparing the plurality of compensation trenches, as was previously performed in traditional techniques.

This is followed by a dry-etch step to etch the poly-silicon from the termination trench. The etching step exposes the first shield oxide layer deposited in the termination trench. In the current process, even with over-etching, the oxide thickness of the first shield oxide layer is preserved at sidewalls and a bottom of the termination trench. That is, the etching process used to remove poly-silicon does not attack the oxide inside the termination trench once the poly-silicon is etched away. The selectivity of the etching process is high, and therefore the oxide thickness on the trench sidewalls and trench bottom remain the same even with high over-etching time. This retention of oxide thickness during etching improves overall process stability.

The method also includes stripping the photoresist layer. The exposed surfaces of the first shield oxide layer is conditioned. For example, a wet-chemical (e.g., diluted hydrofluoric acid, buffered oxide etch [BOE], etc.) clean treatment is performed using a sink or spin rinse tool.

After conditioning, the thickness of the oxide layer in the termination trench is increased to the appropriate thickness through another oxide deposition step. For instance, the method includes depositing a second shield oxide layer over exposed surfaces of the first shield oxide layer to increase oxide thickness in the termination trench.

As such, the first and second shield oxide layers comprise a second predetermined thickness configured for formation of electrodes in the termination trench. Specifically, the poly-silicon electrode can be formed by depositing a doped poly-silicon layer followed by CMP and a recess step to etch back the poly-silicon below the top surface of the semiconductor layer.

Finally, the planarization of the surface of the wafer is achieved by applying an oxide CMP step. In that manner, the wafer is planarized down to the top surface of the semiconductor layer, wherein the charge compensation trench is lined with oxide of a first predetermined thickness and filled with poly-silicon that form the electrodes, and wherein the termination trench is lined with oxide of a second predetermined thickness and filled with poly-silicon that form its electrode. The first predetermined thickness is less than the second predetermined thickness. Additional steps may be performed to fabricate MOSFET devices in conjunction with the dual trench structure.

Thus, according to embodiments of the present disclosure, an dual trench structure and method for fabricating the same are described, wherein the process flow fabricates dual trench structures that are not susceptible to cracking in the charge compensation trenches in subsequent high temperature steps.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples in that many architectural variants can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed:

1. A method for fabricating a dual trench structure, comprising:
    providing a wafer comprising a semiconductor layer including a top surface;
    providing a plurality of charge compensation trenches open to said top surface and formed within said semiconductor layer, wherein said plurality of charge compensation trenches comprises a plurality of charge compensation trench surfaces;
    forming a photoresist layer isolating said plurality of charge compensation trenches;
    providing a termination trench open to said top surface and formed within said semiconductor layer, wherein said termination trench comprises a termination trench surface,
    wherein said plurality of charge compensation trenches are formed to a depth less than a depth of said termination trench;
    filling said plurality of charge compensation trenches and said termination trench with poly-silicon covering said first shield oxide layer; and
    performing recess etch of said poly-silicon to below said top surface of said semiconductor layer;

forming a first shield oxide layer of a first predetermined thickness on said plurality of charge compensation trench surfaces and said termination trench surface;

forming a second shield oxide layer of a second predetermined thickness on said first shield oxide layer within said termination trench; and forming a plurality of voids through centers of said plurality of charge compensation trenches during formation of said first shield oxide layer, wherein said first predetermined thickness of said first shield oxide layer is sufficient to allow formation of said voids.

2. The method of claim 1, further comprising:

etching poly-silicon from said termination trench to expose said first shield oxide layer of said first predetermined thickness.

3. The method of claim 2, further comprising:

stripping said photoresist layer; and cleaning said termination trench to prepare additional oxide formation on said first shield oxide layer.

4. The method of claim 2, wherein said forming a second shield oxide layer comprises:

forming a second shield oxide layer over said first shield oxide layer that is exposed in said termination trench, wherein said first and second shield oxide layers formed in said termination trench comprise a second predetermined thickness sufficient to allow formation of another void in said termination trench, and wherein shield oxide of said first predetermined thickness in said plurality of charge compensation trenches is less thick than shield oxide of said second predetermined thickness in said termination trench.

5. The method of claim 4, further comprising:

filling said termination trench with poly-silicon doped covering said second shield oxide layer; and performing an etch back of said poly-silicon in said termination trench below said top surface of said semiconductor layer.

6. The method of claim 5, further comprising:

performing a shield oxide layer refill of said termination trench; and performing planarization to remove shield oxide down to approximately said top surface of said semiconductor layer while retaining a layer of said shield oxide over said poly-silicon filling said charge compensation trenches and said termination trench.

7. A method for fabricating a dual trench structure, comprising:

simultaneously forming a plurality of charge compensation trenches and a termination trench in a semiconductor layer, wherein said plurality of charge compensation trenches is open to a top surface of said semiconductor layer, and wherein said termination trench is open to said top surface in said semiconductor layer;

oxidizing exposed surfaces of said plurality charge compensation trenches and said termination trench;

depositing a first shield oxide layer of a first predetermined thickness on said surfaces of said plurality of charge compensation trenches and said termination trench that are oxidized, wherein said first predetermined thickness of said first shield oxide layer is configured for formation of electrodes in said charge compensation trenches;

forming a second shield oxide layer of a second predetermined thickness on said first shield oxide layer within said termination trench; and forming a plurality of voids through centers of said plurality of charge compensation trenches during formation of said first shield oxide layer, wherein said first predetermined thickness is configured to allow formation of said voids.

8. The method of claim 7, further comprising:

depositing poly-silicon over said first shield oxide layer and in said plurality of charge compensation trenches and said termination trench;

performing chemical-mechanical planarization (CMP) to remove poly-silicon until reaching said first shield oxide layer covering said top surface of said semiconductor layer; and performing a recess etch of said poly-silicon below said top surface.

9. The method of claim 8, further comprising:

forming a photoresist layer isolating said plurality of charge compensation trenches;

dry etching poly-silicon from said termination trench to expose said first shield oxide layer of said first predetermined thickness;

stripping said photoresist layer;

conditioning exposed surfaces of said first shield oxide layer; and wherein said forming a second shield oxide layer comprises depositing a second shield oxide layer over exposed surfaces of said first shield oxide layer to increase oxide thickness in said termination trench, wherein said first and second shield oxide layers comprise a second predetermined thickness configured for formation of electrodes in said termination trench.

10. The method of claim 9, further comprising:

avoiding use of a nitride hard mask to protect said termination trench to prepare said plurality of charge compensation trenches.

11. The method of claim 9, wherein said dry etching poly-silicon from said termination trench further comprises:

preserving oxide thickness of said first shield oxide layer at sidewalls and a bottom of said termination trench during over-etching.

12. The method of claim 1 wherein said forming a second shield oxide layer takes place after said recess etch.

13. The method of claim 1 wherein said first shield oxide layer comprises tetraethyl orthosilicate oxide.

14. The method of claim 1 wherein said first shield oxide layer is formed by a deposition process.

15. The method of claim 1 wherein said second shield oxide layer is formed by a thermal oxidation process.

16. The method of claim 1 wherein said first and second shield oxide layers are of different composition.

17. A method for fabricating a dual trench structure, comprising:

providing a wafer comprising a semiconductor layer including a top surface;

providing a plurality of charge compensation trenches open to said top surface and formed within said semiconductor layer, wherein said plurality of charge compensation trenches comprises a plurality of charge compensation trench surfaces;

providing a termination trench open to said top surface and formed within said semiconductor layer, wherein said termination trench comprises a termination trench surface;

forming, by a deposition process, a first shield oxide layer of a first predetermined thickness on said plurality of charge compensation trench surfaces and said termination trench surface;

wherein said first shield oxide layer comprises tetraethyl orthosilicate oxide;

forming a second shield oxide layer of a second predetermined thickness on said first shield oxide layer within said termination trench; and forming a plurality of voids through centers of said plurality of charge compensation trenches during formation of said first shield oxide layer, wherein said first predetermined thickness of said first shield oxide layer is sufficient to allow formation of said voids.

* * * * *